US009455196B2

(12) United States Patent
Pradhan et al.

(10) Patent No.: US 9,455,196 B2
(45) Date of Patent: Sep. 27, 2016

(54) METHOD FOR IMPROVING FIN ISOLATION

(71) Applicant: Varian Semiconductor Equipment Associates, Inc., Gloucester, MA (US)

(72) Inventors: Nilay A. Pradhan, Somerville, MA (US); Benjamin Colombeau, Salem, MA (US); Hans-Joachim L. Gossmann, Summit, NJ (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/934,616

(22) Filed: Nov. 6, 2015

(65) Prior Publication Data

US 2016/0133523 A1    May 12, 2016

Related U.S. Application Data

(60) Provisional application No. 62/078,104, filed on Nov. 11, 2014.

(51) Int. Cl.
| H01L 21/04 | (2006.01) |
| H01L 21/8234 | (2006.01) |
| H01L 21/265 | (2006.01) |
| H01L 21/324 | (2006.01) |
| H01L 21/268 | (2006.01) |
| H01L 21/762 | (2006.01) |
| H01L 29/66 | (2006.01) |
| H01L 29/06 | (2006.01) |
| H01L 21/8238 | (2006.01) |

(52) U.S. Cl.
CPC ..... *H01L 21/823431* (2013.01); *H01L 21/268* (2013.01); *H01L 21/26506* (2013.01); *H01L 21/26513* (2013.01); *H01L 21/324* (2013.01); *H01L 21/76224* (2013.01); *H01L 21/823481* (2013.01); *H01L 21/823821* (2013.01); *H01L 21/823878* (2013.01); *H01L 29/0638* (2013.01); *H01L 29/66545* (2013.01)

(58) Field of Classification Search
CPC ............ H01L 21/242; H01L 21/3212; H01L 21/3105; H01L 21/23821; H01L 21/762; H01L 21/02123; H01L 21/02208; H01L 21/041; H01L 21/0257; H01L 21/0445; H01L 27/10879; H01L 27/1104; H01L 29/106; H01L 29/66045
USPC ....... 438/510, 692, 700, 197, 482, 495, 499, 438/501, 508, 509, 514, 748, 753; 257/E21.006, E21.014, E21.052, 257/E21.077, E21.108, E21.112, E21.118, 257/E21.126, E21.127, E21.229, E21.247, 257/E21.248, E21.304, E21.347, E21.545
See application file for complete search history.

(56) References Cited

U.S. PATENT DOCUMENTS

| 6,391,695 B1 * | 5/2002 | Yu | H01L 29/66772 438/166 |
| 6,680,250 B1 * | 1/2004 | Paton | H01L 21/26506 438/660 |
| 7,795,101 B2 * | 9/2010 | Wang | H01L 21/26506 438/305 |
| 9,006,069 B2 * | 4/2015 | Jensen | H01L 29/785 257/288 |
| 2013/0285129 A1 | 10/2013 | Jensen et al. | |

* cited by examiner

Primary Examiner — David Nhu

(57) ABSTRACT

A method of processing a workpiece to create a doped fin structure is disclosed. A portion of the workpiece is subjected to a pre-amorphizing implant to create an amorphized region. This amorphized region is then implanted with dopant species, at an implant energy and dose so that the dopant species are contained within the amorphized region. The doped amorphized region is then subjected to a laser melt anneal which crystallizes the amorphized region. The dopant profile is box-like, and the dopant is confined to the previously amorphized region.

18 Claims, 4 Drawing Sheets

METHOD FOR IMPROVING FIN ISOLATION

This application claims priority of U.S. Provisional Patent Application Ser. No. 62/078,104, filed Nov. 11, 2014, the disclosure of which is incorporated herein by reference in its entirety.

FIELD

Embodiments of the present disclosure relate to methods for improving the isolation of fins for three-dimensional transistor devices.

BACKGROUND

One aspect of three-dimensional transistor design is the use of fin structures. These fin structures are raised structures, which serve as the source and drain regions for the three-dimensional transistors. A gate electrode is disposed perpendicularly across the fin structure, separating the source from the drain. The region of the fin structure beneath the gate is referred to as the channel. The application of a bias voltage to the gate causes a conductive path to be formed in the channel, allowing the passage of current from the source region to the drain region. The removal of this bias voltage destroys the conductive path, effectively isolating the drain region from the source region.

Ideally, the conductive path through the channel is the only path through which electrons may move from the source region to the drain region. However, current may leak from the source region to the drain region via a leakage path disposed beneath the fin structure. Specifically, when the fin structure is implanted with the desired dopant, some of this dopant diffuses to a depth beneath that which is intended. For example, the dopant may diffuse to a depth below the shallow trench isolation (STI).

Therefore, it would be beneficial if there were a method of controlling the leakage current in the fin structure of a three-dimensional transistor. More particularly, it would be advantageous to create better isolation of the fin structure from surrounding structures.

SUMMARY

A method of processing a workpiece to create a doped fin structure is disclosed. A portion of the workpiece is subjected to a pre-amorphizing implant to create an amorphized region. This amorphized region is then implanted with dopant species, at an implant energy and dose so that the dopant species are contained within the amorphized region. The doped amorphized region is then subjected to a laser melt anneal which crystallizes the amorphized region. The dopant profile is box-like, and the dopant is confined to the previously amorphized region.

According to one embodiment, a method of creating a doped fin structure for a three-dimensional transistor is disclosed. The method comprises implanting an amorphizing species into a workpiece to create an amorphized region; implanting a dopant species into the amorphized region; performing a laser melt anneal after the dopant species are implanted into the amorphized region; and performing an etch process to create a doped fin structure.

According to a second embodiment, a method of creating a doped fin structure for a three-dimensional transistor is disclosed. The method comprises implanting an amorphizing species into a workpiece to create an amorphized region; implanting a dopant species into the amorphized region; performing a laser melt anneal after the dopant species are implanted into the amorphized region to form a doped crystalline region; etching the doped crystalline region to form a plurality of doped fin structures; depositing an oxide in spaces between the plurality of doped fin structures; recessing the plurality of doped fin structures to a level below the oxide to create a plurality of recessed regions; growing an undoped epi-silicon layer in the plurality of recessed regions; and etching the oxide to a level where the undoped epi-silicon layer is exposed.

According to a third embodiment, a method of creating a doped fin structure for a three-dimensional transistor is disclosed. The method comprises implanting an amorphizing species into a workpiece to create an amorphized region; implanting a dopant species into the amorphized region; performing a laser melt anneal after the dopant species are implanted into the amorphized region to form a doped crystalline region; growing an undoped epi-silicon layer in the doped crystalline region; etching the workpiece to form a plurality of doped fin structures, each having an undoped epi-silicon layer disposed thereon; and depositing an oxide in spaces between the plurality of doped fin structures.

BRIEF DESCRIPTION OF THE FIGURES

For a better understanding of the present disclosure, reference is made to the accompanying drawings, which are incorporated herein by reference and in which.

DETAILED DESCRIPTION

As described above, leakage current may exist beneath the fin structure. This leakage may be facilitated by the diffusion of dopant beneath the fin structure. This diffused dopant may allow current paths to exist beneath the shallow trench isolation (STI) structures, allowing leakage to occur between adjacent fin structures. In addition, this diffused dopant may allow paths to exist beneath the channel, allowing leakage to occur between the source region and drain region of a fin structure.

In some embodiments, this leakage current may be reduced or eliminated by improving the isolation layer beneath the fin structure. Specifically, by reducing or eliminating the diffusion of dopant below the desired depth beneath the channel, the isolation of the fin structure may be improved.

Figure 1:
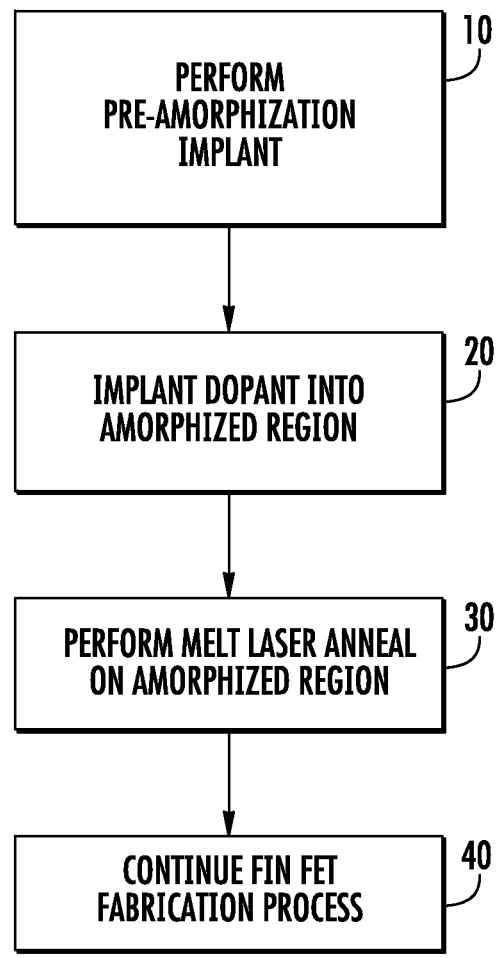
FIG. 1 is a flowchart showing processes to create an isolating region below the fin structure.

FIG. 1 shows a flowchart illustrating processes that may be performed to create a more well-defined demarcation between the doped fin structure and the underlying isolating layer or bulk region. First, as shown in Process 10, a pre-amophization implant (PAI) is performed. This PAI may be used to amorphize the implanted material, which may be silicon in one embodiment. One or more pre-amorphizing species are implanted into the workpiece to a depth equal to the intended depth of the fin structure. These pre-amorphizing species are selected so as not to affect the conductivity of the implanted material. For example, in the case of a silicon workpiece, the pre-amorphizing species used for the PAI may be selected from silicon or germanium.

The PAI creates a region that is no longer crystalline and preferably the region has a uniform depth. This depth may be controlled based on the implant energy and dose of the pre-amorphizing species. In some embodiments, the depth of the amorphized region is equal to the ultimate height of the fin structure, when completed.

Once the region has been amorphized, the amorphized region may be doped with one or more dopant species, as shown in Process 20. In the case of silicon, dopant species may be classified as n-type dopants, such as phosphorus, arsenic, antimony and other Group V elements, and p-type dopants, such as boron, indium and other Group III elements. The implant energy and dose of the dopant species are selected so that the dopant profile is contained within the amorphized region.

In some embodiments, a first portion of the amorphized region may be implanted with n-type dopant species while a second portion of the amorphized region may be implanted with p-type dopant species. The first portion of the amorphized region is used to create n-type fin structures, while the second portion is used to create p-type fin structures. Of course, in some embodiments, the amorphized region may be implanted with only one type of dopant species.

After one or more dopant species has been implanted into the amorphized region, a laser melt anneal is performed as shown in Process 30. Amorphous silicon has a lower melting point than crystalline silicon. Therefore, the laser melt anneal may be performed so as to heat the amorphized region to a temperature greater than the melting point of amorphized silicon, but lower than crystalline silicon. This may restrict the diffusion of dopant species within the amorphized region of the workpiece.

Following the completion of the laser melt anneal, a doped region having a box shaped dopant concentration profile is created in the workpiece. Because of the use of a PAI and a laser melt anneal, the diffusion of dopant species into the crystalline silicon is reduced. At this point, the fabrication of the fin structure and the fin FET may continue, using any fabrication process, as shown in Process 40. In some embodiments, the fin structures may be created using a combination of lithography, deposition and subtractive etch processes. However, other methods may also be used to form the doped fin structures.

Figure 4:
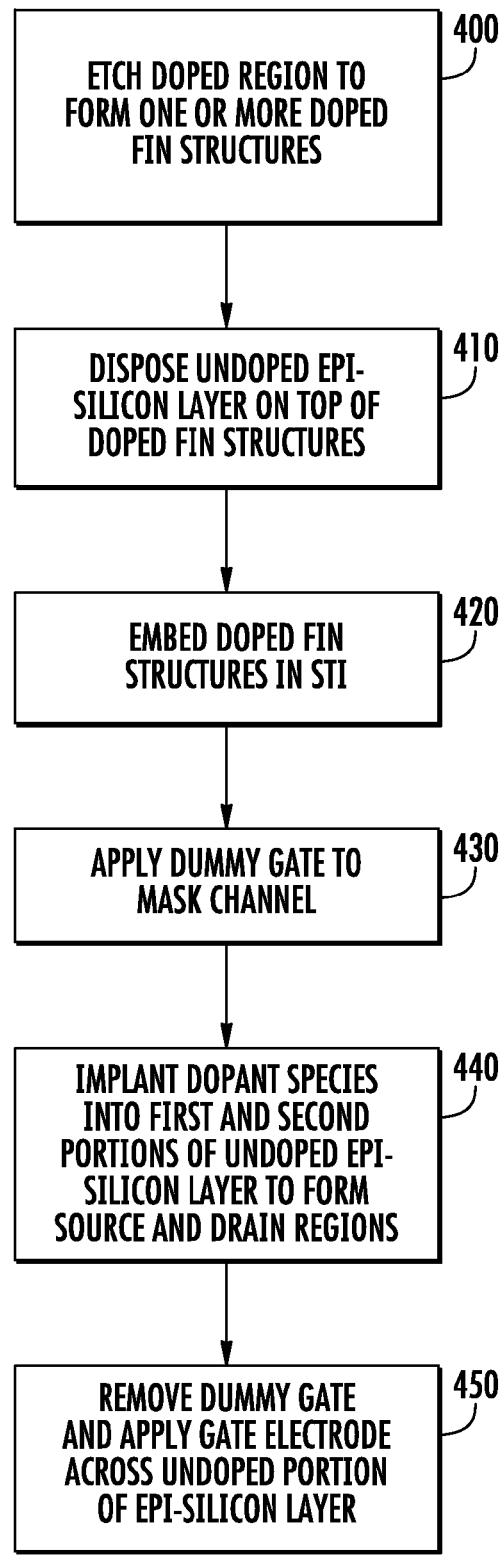
FIG. 4 is a flowchart showing processes used to create a finFET using the doped fin structures of FIGS. 1-3.

FIG. 4 shows a process that may be used to create a finFET according to one embodiment. The doped regions may be etched to form a plurality of doped fin structures, as shown in Process 400. After the doped fin structures have been created, other processes may be used to complete the assembly of the fin FET. For example, in one embodiment, an undoped epi-silicon layer is then disposed on top of these doped fin structures, as shown in Process 410. These doped fin structures may be embedded in an oxide, which forms a shallow trench isolation (STI), as shown in Process 420. A dummy gate is then applied across the fin, where the channel of the finFET will be disposed, as shown in Process 430. This dummy gate is used to insure that subsequent ion dopant processes do not implant ions into the channel. The undoped epi-silicon layer, which extends above the STI, is then implanted with a dopant species having a conductivity opposite than of the underlying fin structure, as shown in Process 440. In other words, a p-type dopant species may be implanted in the epi-silicon layer disposed on an n-type fin structure. Similarly, an n-type dopant species may be implanted in the epi-silicon layer disposed on a p-type fin structure. The dopant species is implanted into first and second portions, which will serve as the source region and drain region for the finFET, respectively. The dummy gate serves to separate these two portions from one another and to inhibit the doping of the channel. In this embodiment, the previously created doped fin structures serve as isolation barriers for the source and drain regions.

Finally, the dummy gate is removed and a gate electrode may be applied perpendicularly across the undoped portion of the epi-silicon layer, which separates the source region and the drain region of the finFET, as shown in Process 450.

Figure 2:
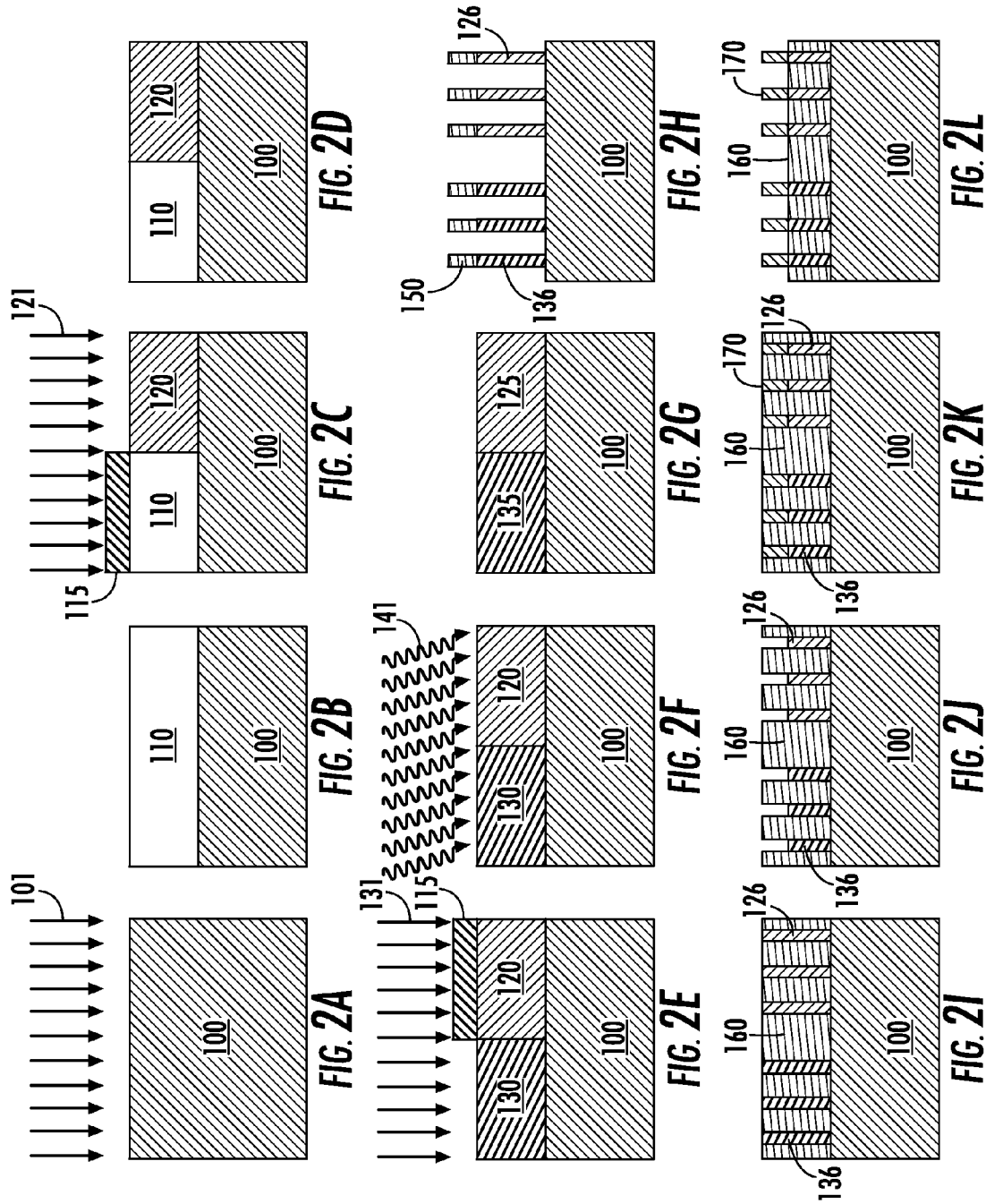
FIGS. 2A-2L is a first sequence to improve fin isolation on three-dimensional transistor devices.

FIGS. 2A-L show a sequence of fabrication processes that may be used to create a plurality of doped fin structures having improved isolation. First, as shown in FIG. 2A, a workpiece 100, which may be a silicon workpiece, is ion implanted with ions of one or pre-amorphizing species 101. This ion implant, as well as all of the subsequent ion implants, may be performed using any type of ion implanter, including a beamline ion implanter, a plasma chamber or others known in the art. As described above, the pre-amorphizing species may be one or more atoms or molecules comprising silicon or germanium. Other species that do not affect the electrical conductivity of the workpiece 100 may also be employed.

The ion implantation of the pre-amorphizing species 101 creates an amorphized region 110, as shown in FIG. 2B. This amorphized region 110 may comprise amorphous silicon, while the remainder of the workpiece 100 remains crystalline. The depth of the amorphized region 110 may be determined based on the implant energy and dose of the pre-amorphizing species. Further, the amorphized region 110 may reach a uniform depth within the workpiece 100. In some embodiments, the depth of the amorphized region 110 is equal to the ultimate height of the fin structure, when completed.

After the amorphized region 110 has been created, the amorphized region 110 can then be doped to create p-type regions, n-type regions, or a combination of n-type and p-type regions. In FIG. 2C, a photoresist 115 is disposed on a first portion of the top surface of the amorphized region 110. Although not shown, the photoresist 115 may also be disposed on other surfaces of the workpiece that have not been amorphized.

This photoresist 115 is used to block p-type dopant species 121 from implanting the amorphized region 110 disposed beneath the photoresist 115. Although, photoresist 115 is described as the mechanism to block the implantation of p-type dopant species 121, other mechanisms may be used. For example, a shadow mask may be used to block p-type dopant species 121 from implanting the covered portion of the amorphized region 110. As described above, the p-type dopant species 121 may be any atomic or molecular ion comprising a Group 3 element, such as boron or indium. The ion implantation of p-type dopant species 121 into a portion of the amorphized region 110 creates a p-doped amorphized region 120. The dose and implant energy of the p-type dopant species 121 is selected so that the resulting dopant profile is contained within the amorphized region 110. After the completion of this process, the p-doped amorphized region 120 comprises amorphized silicon doped with p-type dopant species 121.

As shown in FIG. 2D, the photoresist 115 is removed using standard techniques. At this time, a portion of the amorphized region 110 is now a p-doped amorphized region 120, while a second portion of the amorphized region 110 has no dopant.

A photoresist 115 or other mask is then disposed on or near the surface of p-doped amorphized region 120 to inhibit the implantation of n-type dopant species 131, as shown in FIG. 2E. Although not shown, the photoresist 115 may also be disposed on other surfaces of the workpiece that have not been amorphized. The n-type dopant species 131 may be any atomic or molecular ion comprising a Group 5 element, such as phosphorus, arsenic or antimony. The n-type dopant species 131 is then implanted into a portion of the amorphized region 110 that was not implanted with p-type dopant species 121. The dose and implant energy of the n-type dopant species 131 is selected so that the resulting dopant profile is contained within the amorphized region 110. After the n-type dopant species 131 has been implanted, an n-doped amorphized region 130 has been created. After, the photoresist 115 is removed from the surface of the p-doped amorphized region 120.

While this sequence shows a p-type dopant species being implant prior to the n-type dopant species 131, other embodiments are also possible. For example, the n-type dopant species 131 may be implanted first. In other embodiments, only one of n-type dopant species 131 and p-type dopant species 121 are implanted into the amorphized region 110.

Following the doping of the amorphized region 110, the workpiece 100 is exposed to a laser melt anneal 141, as shown in FIG. 2F. The laser melt anneal 141 may be a pulsed laser anneal of a predetermined duration, energy density and pulse frequency. These parameters may be chosen in order to melt the workpiece 100 only to the depth of the amorphized region 110, making use of the fact that the melting point of amorphous silicon is lower than crystalline silicon. This laser melt anneal 141 may result in the rapid melt and recrystallization of the workpiece 100 with the dopant concentration having a box-like profile within the previous amorphized region 110. In this way, it may be possible to incorporate both p-type dopant species 121 and n-type dopant species 131 within the same anneal process, saving processing time and cost. In another embodiment, the implantation and annealing of the p-type dopant species 121 may be separate from the implantation and annealing of the n-type dopant species 131.

After completion of the laser melt anneal 141, the workpiece 100 now includes a doped crystalline region, which may include one or more p-doped crystalline regions 125 and n-doped crystalline regions 135, as shown in FIG. 2G. As described above, due to the PAI and laser melt anneal 141, the dopant profile is box-like with a plane delineating the p-doped crystalline region 125 and the n-doped crystalline region 135 from the rest of the workpiece 100. In other words, diffusion of p-type dopant species 121 and n-type dopant species 131 into the bulk of the workpiece 100 is reduced by the incorporation of these processes.

In this sequence, the n-doped fin structures 136 and p-doped fin structures 126 are now created. First, a hard mask 150 is disposed on the surface of the workpiece 100 in those positions where the fin structures are to be formed. After the hard mask 150 has been applied, successive double patterning processes known to those of ordinary skill in the art may be used to create a hard mask 150 having the desired critical dimension, shown in FIG. 2H. After the hard mask 150 having the desired critical dimension is created, a subtractive etching process is performed, which removes material in those areas that are not covered by the hard mask 150, as shown in FIG. 2H. The subtractive etch process is performed until the bottom of the previously amorphized region 110 is reached. Thus, at this point, the p-doped fin structures 126 extend the entire height of the previously amorphized region 110. Similarly, the n-doped fin structures 136 also extend the entire height of the previously amorphized region 110. Since the dopant profile in box-like, the p-type dopant species 121 may extend only to the bottom of the p-doped fin structures 126 and not into the rest of the workpiece 100. Similarly, the n-type dopant species 131 may extend only to the bottom of the n-doped fin structures 136 and not into the rest of the workpiece 100.

After the subtractive etch process has been completed, the hard mask 150 may be removed. An insulating material, such as an oxide, is then deposited or grown in the regions between the p-doped fin structures 126 and n-doped fin structures 136. This insulating material serves as the shallow trench isolation (STI) 160. After the insulating material has been grown or deposited, the top of the workpiece 100 is subjected to a chemical mechanical planarization (CMP) operation, which insures that the p-doped fin structures 126, the n-doped fin structures 136 and the STI 160 are of the same height, as shown in FIG. 2I.

After the CMP operation, the p-doped fin structures 126 and n-doped fin structures 136 are recessed to a level below the STI 160, as shown in FIG. 2J. In some embodiments, the amount of this recess is substantially equal to the channel height of the completed fin FET. The fin structures may be recessed using an etch process.

After the fin structures have been recessed, an undoped epi-silicon layer 170 is grown on top of the recessed fin structures. In other words, the epi-silicon is grown in the recessed regions between the STI 160, as shown in FIG. 2K. In some embodiments, the epi-silicon is grown until the epi-silicon reaches the height of the STI 160.

Finally, the STI 160 is etched until its height is aligned to the start of the dopant concentration in the fin structures. At this point, the doped portion of the fin structures are buried in the STI 160, and only the undoped epi-silicon layer 170 is extending above the level of the STI 160, as shown in FIG. 2L.

After the doped fin structures have been created, other processes may be used to complete the assembly of the fin FET. For example, a dummy gate is then applied across the fin, where the channel of the finFET will be disposed, as shown in Process 430 (see FIG. 4). This dummy gate is used to insure that subsequent ion dopant processes do not implant ions into the channel. First and second portions of the undoped epi-silicon layer 170 disposed on the n-doped fin structures 136 may be implanted with p-type dopants, such as atomic or molecular ions comprising a Group 3 element. First and second portions of the undoped epi-silicon layer 170 disposed on the p-doped fin structures 126 may be implanted with n-type dopants, such as atomic or molecular ions comprising a Group 5 element. These implants may be angled implants to insure that all surfaces of the undoped epi-silicon layer 170 are implanted with dopant species. This implant is shown in Process 440 of FIG. 4

These first and second portions of the epi-silicon layer serve as the source region and drain region of the completed finFET, respectively. The dummy gate serves to separate these two portions from one another and to inhibit the doping of the channel. A portion of the epi-silicon layer, corresponding to the channel, may not be doped due to the presence of the dummy gate. Specifically, an undoped portion of the epi-silicon layer may be disposed between the first and second doped portions. Finally, the dummy gate is removed and a gate electrode may be applied perpendicularly across the fin structure over the undoped portion of the fin structure, as shown in Process 450 (see FIG. 4).

Because the portion of the doped fin structure that is embedded in the STI 160 is the opposite conductivity of the doped epi-silicon layer disposed thereon, this embedded portion serves as an improved isolation barrier. This method of forming the isolation barrier lowers the dopant concentration in the channel region of the device and provides better protection against device to device variability, this improving process margin.

Figure 3:
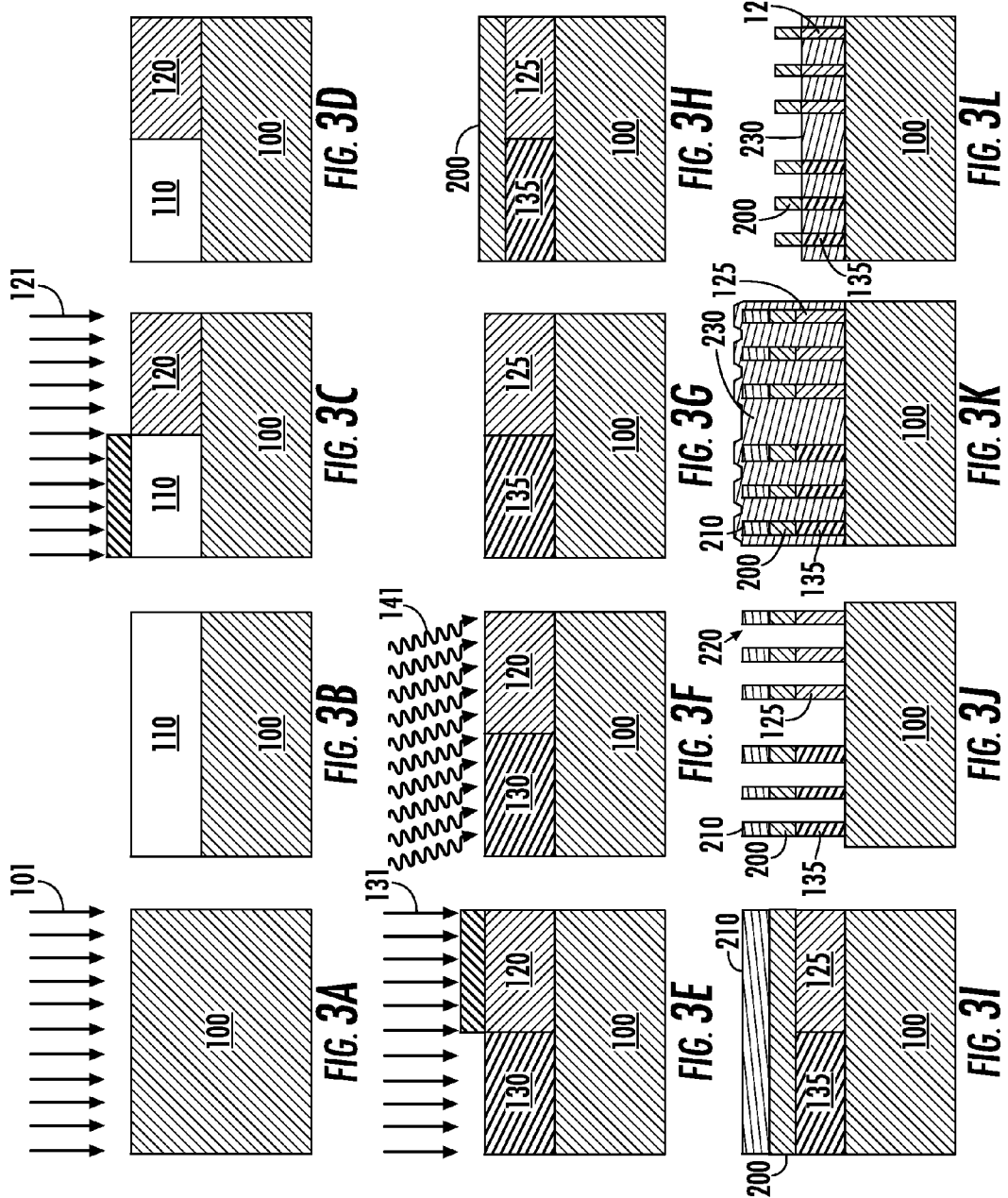
FIGS. 3A-3L is a second sequence to improve fin isolation on three-dimensional transistor devices.

FIGS. 3A-3L show a second sequence that can be used to create the fin structures shown in FIG. 2L. The processes for FIGS. 3A-3G are the same as described with respect to FIGS. 2A-2G and will not be repeated. FIG. 3G shows a workpiece 100 having a p-doped crystalline region 125 and an n-doped crystalline region 135.

An undoped epi-silicon layer 200 is then deposited or grown on the top surface of the workpiece 100, as shown in FIG. 3H. The thickness of this undoped epi-silicon layer 200 may be the same as the channel height of the completed fin FET.

A hard mask 210 is then applied to the top of the undoped epi-silicon layer 200, as shown in FIG. 3I. Successive double patterning processes known to those of ordinary skill in the art may be used to create the hard mask 210 having the desired critical dimension, shown in FIG. 3J. After the hard mask 210 having the desired critical dimension is created, the workpiece 100 is then anisotropically etched to create the fin structures 220. These fin structures 220 include a doped region, which may be p-doped crystalline region 125 or n-doped crystalline region 135, which is beneath an undoped epi-silicon layer 200 and a hard mask 210, as shown in FIG. 3J.

After the fin structures 220 have been formed, an oxide is deposited or grown on the workpiece 100, forming an STI 230. The STI 230 covers the fin structures 220, as shown in FIG. 3K.

Finally, the STI 230 is etched to expose the undoped epi-silicon layer 200 of the fin structures 220, while leaving the doped regions covered. Additionally, the hard mask 210 is removed, resulting in the structure shown in FIG. 3L.

Of course, other fin structures may also be fabricated using the PAI and laser melt annealing processes described herein. For example, in some embodiments, the exposed portion of the fin structures (i.e. the portion of the fin structure that extends above the STI 160) may be doped. This may be achieved, for example, by eliminating the blanket deposition of undoped epi-silicon, shown in FIG. 3H.

After the doped fin structures have been created, other processes may be used to complete the assembly of the fin FET. For example, a dummy gate is then applied across the fin, where the channel of the finFET will be disposed, as shown in Process 430 (see FIG. 4). This dummy gate is used to insure that subsequent ion dopant processes do not implant ions into the channel. First and second portions of the undoped epi-silicon layer 200 disposed on the n-doped crystalline region 135 may be implanted with p-type dopants, such as atomic or molecular ions comprising a Group 3 element. First and second portions of the undoped epi-silicon layer 200 disposed on the p-doped crystalline region 125 may be implanted with n-type dopants, such as atomic or molecular ions comprising a Group 5 element. These implants may be angled implants to insure that all surfaces of the undoped epi-silicon layer 200 are implanted with dopant species. This implant is shown in Process 440 of FIG. 4

These first and second portions of the epi-silicon layer serve as the source region and drain region of the completed finFET, respectively. The dummy gate serves to separate these two portions from one another and to inhibit the doping of the channel. A portion of the epi-silicon layer, corresponding to the channel, may not be doped due to the presence of the dummy gate. Specifically, an undoped portion of the epi-silicon layer may be disposed between the first and second doped portions. Finally, the dummy gate is removed and a gate electrode may be applied perpendicularly across the fin structure over the undoped portion of the fin structure, as shown in Process 450 (see FIG. 4).

Because the portion of the doped fin structure that is embedded in the STI 160 is the opposite conductivity of the doped epi-silicon layer disposed thereon, this embedded portion serves as an improved isolation barrier. This method of forming the isolation barrier lowers the dopant concentration in the channel region of the device and provides better protection against device to device variability, this improving process margin.

The embodiments of the present disclosure have many advantages. First, as described above, the isolation improves the device to device variability that occurs due to dopant level fluctuation inside the device channel. Additionally, the present isolation techniques control the leakage current in the fin structure of a three-dimensional current by minimizing the amount of dopant in the device channel. Specifically, dopant species are implanted into a box-like region, and the find extend to the bottom of this region. Thus, little or no dopant is present in the workpiece below the fins. These improvements may allow improved process margin in the fabrication process.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating a doped fin structure for a three-dimensional transistor, the method comprising:
    implanting an amorphizing species into a workpiece to create an amorphized region;
    implanting a dopant species into said amorphized region;
    performing a laser melt anneal after said dopant species are implanted into said amorphized region to form a doped crystalline region; and
    etching the doped crystalline region to create a doped fin structure.

2. The method of claim 1, wherein an implant energy and dose of said dopant species is selected so that said dopant species are contained within said amorphized region.

3. The method of claim 1, wherein said laser melt anneal is performed at a temperature greater than a melting point of said amorphized region and lower than a melting point of crystalline silicon.

4. The method of claim 1, wherein a depth of said amorphized region is equal to a height of said doped fin structure.

5. The method of claim 1, further comprising:
disposing an undoped epi-silicon layer on top of said doped fin structure;
embedding said doped fin structure in an oxide;
disposing a dummy gate over the undoped epi-silicon layer in a location where a channel of a finFET will be disposed;
implanting a second dopant species into first and second portions of said undoped epi-silicon layer after the disposing of the dummy gate to form a source region and a drain region, respectively, wherein said second dopant species has a conductivity opposite from said dopant species;
removing the dummy gate after the implanting; and
applying a gate electrode across the channel of said undoped epi-silicon layer disposed between said source region and said drain region.

6. The method of claim 1, wherein the dopant species are contained within said amorphized region, and said doped fin structure extends to a bottom of the amorphized region, so as to reduce or eliminate leakage current between adjacent fin structures.

7. A method of creating a doped fin structure for a three-dimensional transistor, the method comprising:
implanting an amorphizing species into a workpiece to create an amorphized region;
implanting a dopant species into said amorphized region;
performing a laser melt anneal after said dopant species are implanted into said amorphized region to form a doped crystalline region;
etching said doped crystalline region to form a plurality of doped fin structures;
depositing an oxide in spaces between said plurality of doped fin structures;
recessing said plurality of doped fin structures to a level below said oxide to create a plurality of recessed regions;
growing an undoped epi-silicon layer in said plurality of recessed regions; and
etching said oxide to a level where said undoped epi-silicon layer is exposed.

8. The method of claim 7, further comprising:
disposing a dummy gate over the undoped epi-silicon layer in a location where a channel of a finFET will be disposed;
implanting a second dopant species into first and second portions of said undoped epi-silicon layer after the disposing of the dummy gate to form a source region and a drain region, respectively, wherein said second dopant species has a conductivity opposite from said dopant species;
removing the dummy gate after the implanting; and
applying a gate electrode across the channel of said undoped epi-silicon layer disposed between said source region and said drain region.

9. The method of claim 7, wherein an implant energy and dose of said dopant species is selected so that said dopant species are contained within said amorphized region.

10. The method of claim 7, wherein said laser melt anneal is performed at a temperature greater than a melting point of said amorphized region and lower than a melting point of crystalline silicon.

11. The method of claim 7, wherein a depth of said amorphized region is equal to a height of said doped fin structure.

12. The method of claim 7, wherein the dopant species are contained within said amorphized region, and said doped fin structure extends to a bottom of the amorphized region, so as to reduce or eliminate leakage current between adjacent fin structures.

13. A method of creating a doped fin structure for a three-dimensional transistor, the method comprising:
implanting an amorphizing species into a workpiece to create an amorphized region;
implanting a dopant species into said amorphized region;
performing a laser melt anneal after said dopant species are implanted into said amorphized region to form a doped crystalline region;
growing an undoped epi-silicon layer in said doped crystalline region;
etching said workpiece to form a plurality of doped fin structures, each having an undoped epi-silicon layer disposed thereon; and
depositing an oxide in spaces between said plurality of doped fin structures.

14. The method of claim 13, further comprising:
disposing a dummy gate over the undoped epi-silicon layer in a location where a channel of a finFET will be disposed;
implanting a second dopant species into first and second portions of said undoped epi-silicon layer after the disposing of the dummy gate to form a source region and a drain region, respectively, wherein said second dopant species has a conductivity opposite from said dopant species;
removing the dummy gate after the implanting; and
applying a gate electrode across the channel of said undoped epi-silicon layer disposed between said source region and said drain region.

15. The method of claim 13, wherein an implant energy and dose of said dopant species is selected so that said dopant species are contained within said amorphized region.

16. The method of claim 13, wherein said laser melt anneal is performed at a temperature greater than a melting point of said amorphized region and lower than a melting point of crystalline silicon.

17. The method of claim 13, wherein a depth of said amorphized region is equal to a height of said doped fin structure.

18. The method of claim 13, wherein the dopant species are contained within said amorphized region, and said doped fin structure extends to a bottom of the amorphized region, so as to reduce or eliminate leakage current between adjacent fin structures.

* * * * *